United States Patent
Biallas et al.

(10) Patent No.: US 9,290,838 B2
(45) Date of Patent: Mar. 22, 2016

(54) ANTI-DIFFUSION METAL COATED O-RINGS

(75) Inventors: George Herman Biallas, Yorktown, VA (US); James Reid Boyce, Williamsburg, VA (US)

(73) Assignee: JEFFERSON SCIENCE ASSOCIATES, LLC, Newport News, VA (US)

( * ) Notice: Subject to any disclaimer, the term of this patent is extended or adjusted under 35 U.S.C. 154(b) by 42 days.

(21) Appl. No.: 13/491,865

(22) Filed: Jun. 8, 2012

(65) Prior Publication Data

US 2014/0117629 A1    May 1, 2014

(51) Int. Cl.
| | |
|---|---|
| F16J 15/00 | (2006.01) |
| C23C 14/20 | (2006.01) |
| C23C 14/56 | (2006.01) |
| C23C 16/06 | (2006.01) |
| C23C 16/44 | (2006.01) |
| F16J 15/12 | (2006.01) |

(52) U.S. Cl.
CPC ............ *C23C 14/20* (2013.01); *C23C 14/564* (2013.01); *C23C 16/06* (2013.01); *C23C 16/4409* (2013.01); *F16J 15/128* (2013.01)

(58) Field of Classification Search
CPC .................. F16J 15/06; F16J 15/064
USPC ........................... 277/650, 652, 653
See application file for complete search history.

(56) References Cited

U.S. PATENT DOCUMENTS

| | | | | |
|---|---|---|---|---|
| 3,375,016 | A | * | 3/1968 | Jellinek et al. ............... 277/645 |
| 3,747,963 | A | * | 7/1973 | Shivak ........................ 285/336 |
| 4,383,694 | A | * | 5/1983 | Fontana ....................... 277/650 |
| 5,069,227 | A | * | 12/1991 | Maronian ..................... 128/844 |
| 5,269,540 | A | * | 12/1993 | Nobuchi et al. .............. 277/591 |
| 5,538,262 | A | * | 7/1996 | Matsumura .................. 277/608 |
| 2006/0220324 | A1 | * | 10/2006 | Anderson et al. ............ 277/606 |

OTHER PUBLICATIONS

B. Visentin, Proc. of the 11th Workshop of RF Superconductivity, Germany (2003), TUO 01.
Knobloch et al., Proc. of the 9th Workshop of RF Superconductivity, USA (1999), p. 77.
K. Saito, Proc. of the 11th Workshop of RF Superconductivity, Germany (2003), THP 15.
H. Diepers et al., Physics Lett. 37A (1971) p. 139.
K. Saito, Proc. of the 4th Workshop of RF Superconductivity, Japan (1989), p. 635.

* cited by examiner

*Primary Examiner* — Gilbert Lee

(57) ABSTRACT

A method for inhibiting diffusion of gases and/or transmission of photons through elastomeric seals and a diffusion inhibiting elastomeric seal wherein at least a portion of the surface of a diffusion inhibiting elastomeric seal is coated with a compatibly-deformable, malleable metal coating.

6 Claims, 2 Drawing Sheets

ANTI-DIFFUSION METAL COATED O-RINGS

The United States government may have certain rights to this invention under Management and Operating Contract No. DE-AC05-06OR23177 from Department of Energy.

FIELD OF INVENTION

The present invention relates to high performance elastomeric seals that inhibit gas diffusion and in some embodiments are opaque to all wavelengths of light.

BACKGROUND OF THE INVENTION

To maintain a high vacuum in systems such as apparatuses and/or equipment that operate at high vacuum measures must be taken to not only remove gases from the system to obtain the vacuum but also to prevent diffusion of gases into the system. Connections between components are particularly vulnerable to leakage and/or diffusion of gases into the system.

Typically, low-tech seals such as conventional o-rings do not provide satisfactory seals to inhibit gas diffusion in high vacuum and ultra-high vacuum apparatuses. To provide a satisfactory seal in high vacuum applications, full metallic gaskets are usually required to seal connections between components. While metal gaskets can provide the requisite seal, they have at least three major drawbacks. First full metal gaskets are expensive, secondly, they are single use items and a new gasket is required to reestablish the seal if the seal is broken, and thirdly the gasket must be carefully "seated" and bolted into place to be effective.

Diffusion of gases is not the only "leakage" associated with conventional elastomeric seals. In systems such as systems utilizing lasers leakage of light or photons through seals may also be a problem. As with gases, metal gaskets can provide the requisite seal to block photons, but are expensive, single use and have challenges in installation. Many elastomeric materials have the ability to block some wavelengths of light but typically are transparent to other wavelengths. Thus, in applications in which all wavelengths need to be blocked elastomeric materials are not adequate.

Accordingly, there is a need for a relatively inexpensive, practical, convenient device for sealing the connections between components in high vacuum and ultra-high vacuum system to prevent diffusion of gases and/or photons.

SUMMARY OF THE INVENTION

The invention provides a method for inhibiting diffusion though elastomeric seals. The method comprises providing an elastomeric seal having a surface and applying a coating of a malleable metal to at least a portion of the surface of the elastomeric seal.

Further, the invention provides a diffusion inhibiting o-ring comprising an elastomeric material configured as an o-ring having an surface wherein at least a portion of the surface of the o-ring is coated with a malleable metal.

DESCRIPTION OF THE DRAWINGS

FIG. 1a is a cut away perspective view of an exemplary embodiment of an o-ring coated on the o-ring exterior surface region with a malleable metal; FIG. 1b is a cut away perspective view of an exemplary embodiment of an o-ring coated on the o-ring interior surface region with a malleable metal; FIG. 1c is a cut away perspective view of an exemplary embodiment of an o-ring coated on the entire surface with a malleable metal.

DETAILED DESCRIPTION OF INVENTION

Figure 1A:
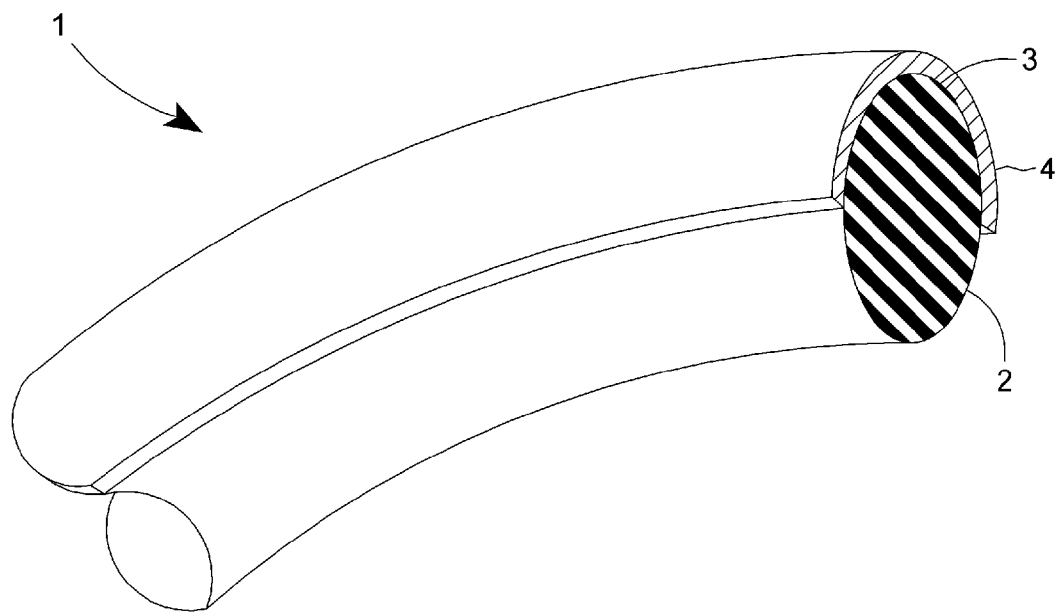
FIG. 1a-c shows exemplary embodiments of o-rings coated with a thin layer of malleable metal.

The present invention includes a method for producing a diffusion inhibiting elastomeric seal suitable for use in high vacuum and ultra-high vacuum applications. The method comprises coating at least a portion of the surface of an elastomeric seal with a thin layer of metal. Additionally, the invention includes diffusion inhibiting elastomeric seals. A diffusion inhibiting o-ring is exemplary of a diffusion inhibiting elastomeric seal. In some embodiments, the diffusion inhibiting elastomeric seals also are opaque to light and prevent the passage of selected wavelengths and in some embodiments light photons of all wavelengths through the diffusion inhibiting seal.

The method and seals of the invention have significant advantages over the metal gaskets currently used in high vacuum and ultra-high vacuum applications, namely they are much less expensive, are reusable and convenient to install.

As used here in "compatibly deformable" means that the coating deforms with the elastomer of the the seal as pressure is applied to the seal without breaking, cracking or detaching the coating from the elastomer of the seal, i.e. the coating deforms as one with the seal when pressure is applied.

As used herein "o-ring surface" refers to the entire outer surface of an o-ring; "o-ring exterior surface" refers to the outer surface of an o-ring as viewed in cross section of the entire O-ring; and "o-ring interior surface" refers to the inner surface of an o-ring as viewed in cross section of the entire o-ring. As one skilled in the art will appreciate, there is typically no distinct line of differentiation between the "o-ring interior surface" and "o-ring exterior surface", thus references to coating the o-ring interior surface or o-ring exterior surface should be taken to mean that the coating is preferentially applied to the indicated area and little on no coating is applied the other of the interior or exterior surface. As used herein "the body of the o-ring" is the solid portion of the o-ring.

As used herein "an elastomeric seal" is a seal made from an elastomeric material such as a synthetic polymer or rubber, for example. Viton, a bakable synthetic polymer, is exemplary of a suitable synthetic polymer.

As used herein "diffusion inhibiting seal" means a seal that prevents the diffusion of gases through the seal. While seals generally prevent flow of gases at a connection, conventional elastomeric seals typically permit some diffusion of gases through the elastomer itself, particularly in apparatuses in which the seal is sealing a high vacuum region from a region of higher pressure. Gas diffusion, particularly diffusion of helium, can be problematic in high performance applications.

As used herein a "reusable seal" means that the seal may be used to form a high vacuum or ultra-high vacuum seal and if the seal is broken, the reusable seal may be used again as a seal. This is in contrast to metal gaskets which must be replaced with a new gasket if the seal is broken.

As used herein "opaque to light" means that light photons are prevented from passing though the the material or object designated as opaque to light. The opaque to light object may prevent photons of all wavelengths of light or photons of selected wavelengths. Visible light means photons having a wavelength that falls within the visible spectrum.

In one exemplary embodiment the elastomeric seal is an o-ring. The o-ring is formed from an elastomeric material that forms a dynamic seal system such that pressure from a high pressure side of the seal forces the elastomer into corners or regions exposed to low pressure or vacuum. Conventional elastomeric materials such as synthetic polymers such as Viton or natural polymers such as rubber are exemplary of suitable materials for forming the o-ring. In a representative embodiment, the portion of the o-ring that is exposed to low pressure or vacuum is coated with a thin layer of a malleable metal. At least a portion of the surface of the o-ring is coated with a thin layer of metal. The coating is applied in such a way and of a thickness that the metal is compatibly deformable with the elastomeric material of the o-ring when pressure is applied to the o-ring to form a seal.

Figure 1B:
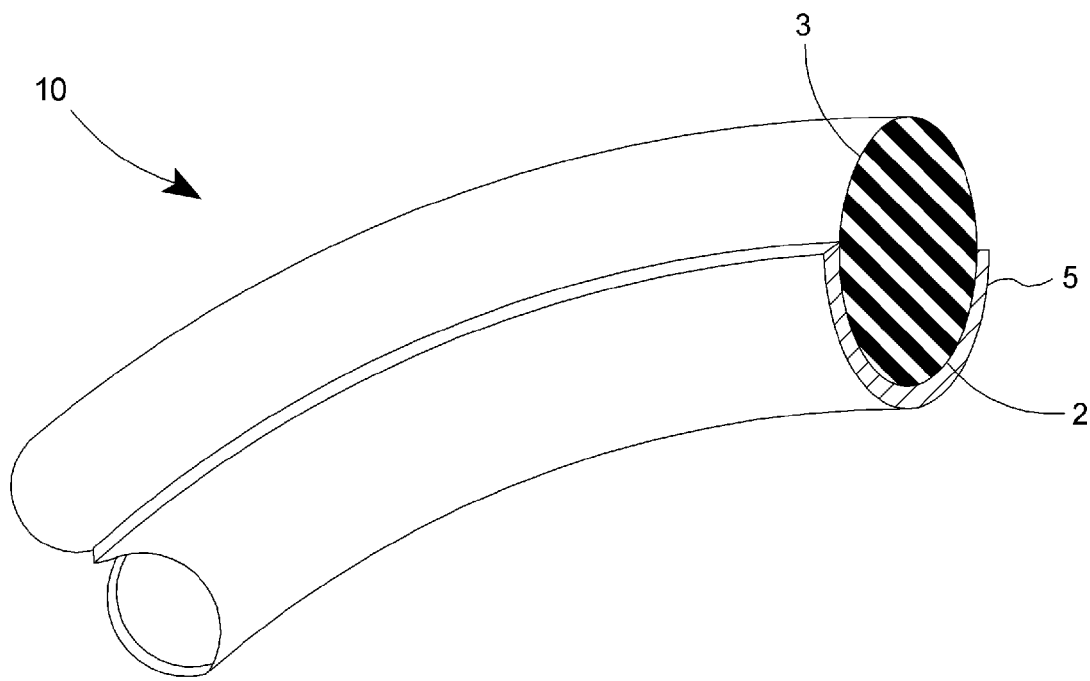
Figure 1C:
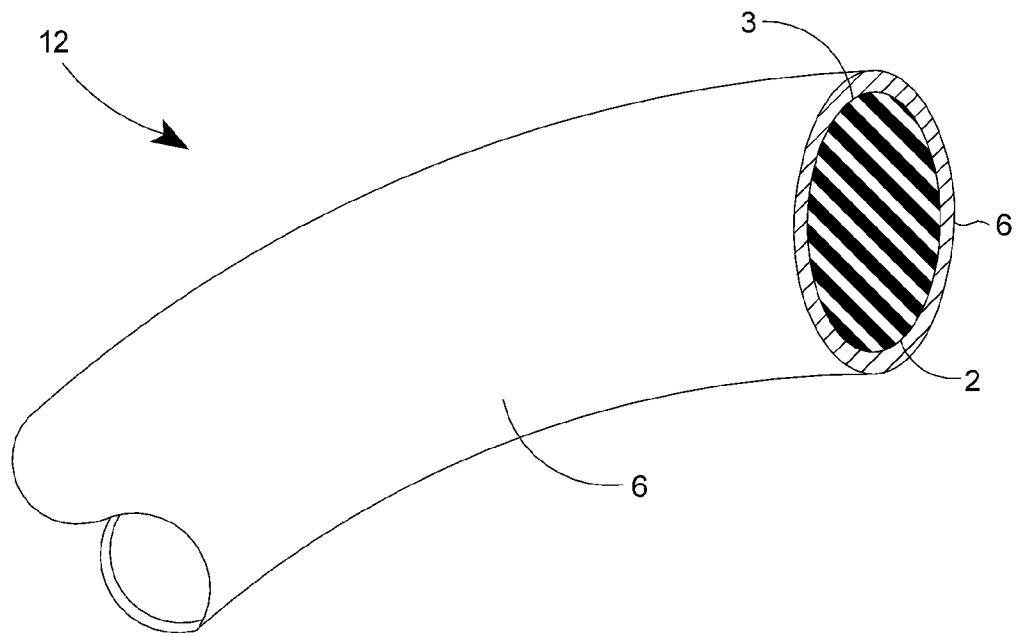

At least a portion of the surface of the o-ring is coated with a thin layer of metal. FIG. 1a-c show cut away perspective views of exemplary metal coated o-rings. In FIG. 1a, the o-ring 1 is coated with a thin external metal layer 4 on exterior surface 3 and the interior surface 2 remains uncoated. In FIG. 1b, the o-ring 10 is coated with a thin internal metal layer 5 on interior surface 2 and the exterior surface 3 remains uncoated. FIGS. 1a and 1b are exemplary of the many possible configurations for coating a portion of the o-ring. In one exemplary embodiment, the portion of the o-ring that is to remain uncoated may be covered with a mask during the coating process to facilitate partial coating of the o-ring. In FIG. 1c, the o-ring 12 is coated with a thin overall metal layer 6 over the entire surface of the o-ring.

The extent to which the surface of the o-ring is coated with metal is important because the coated o-ring may form a dual seal. The dual seal may be formed at contact surfaces where the uncoated elastomer forms a primary seal on the primary seal portion of the contact surface area and the metal coating establishes a secondary seal and creates a diffusion barrier on the metal coating portion of the contact surface area. The extent of the thin metal coating and the thickness of the thin metal coating on the o-ring are typically determined by factors related to the intended use of the seal such as the type of metal to be used for the coating, what gases and/or photons are to be blocked, the pressure to which the seal will be subjected, the degree of vacuum in the sealed region, and whether or not the seal will be exposed to corrosive fluids or a solvent that would deteriorate the elastomer, for example.

Any malleable metal may be use for the coating. Exemplary metals include but are not limited to aluminum, copper, gold, indium, rhodium, platinum and combinations thereof. Aluminum offers the advantage of being malleable and quite inexpensive. Noble metals such as gold and platinum, which not only are malleable but also resistant to corrosion, may be desirable for applications in which the o-rings may be subjected to corrosive materials. Additionally, gold is particularly useful for blocking photons of all wavelengths. Accordingly, in embodiments in which it is desirable to block photons a gold coating may be preferred.

The thickness of the metal coating will depend on the density of the specific metal used and the nature of the desired barrier. Typically the minimum coating thickness needed to block photons is greater than that to inhibit gas diffusion. In some exemplary embodiments the metal coating will have a thickness of about 100 Å to about 2000 Å or alternatively about 100 Å to about 1000 Å.

While the primary function of the coated elastomeric seals of the invention is to prevent diffusion of gases and/or photons through the seal, the metal-coated elastomeric seals of the invention may provide other benefits in some embodiments. For example, in some embodiments the coating may prevent the elastomeric material from expelling gas from the elastomeric material (i.e. "out gassing") and contributing to gas diffusion and/or facilitate protecting the elastomeric material from degradation by solvents or other corrosive materials.

The elastomeric seal can be coated with the malleable metal by any method that deposits a thin and substantially complete coating over the portion of the surface of the seal to be coated. Not only should the coating be continuous over the portion of the surface of the seal to be coated but it should be compatibly deformable with the seal. As used here in "compatibly deformable" means that the coating deforms with the the seal as pressure is applied to the seal without the coating breaking, cracking or detaching from the seal, i.e. the metal coating deforms as one with the seal when pressure is applied. Exemplary methods for coating included, but are not limited to, vapor deposition, chemical vapor deposition, laser or electron beam deposition and sputtering.

In a typical vapor deposition, the substrate to be coated is placed in an evacuated vessel and exposed to the metal vapor evaporating from a heated crucible. The metallic vapor condenses on the substrate, forming the desired coating.

In typical chemical vapor deposition, the substrate to be coated is exposed to one or more volatile precursors which react and/or decompose on the surface to be coated to produce the desired coating. Types of chemical vapor depositions (CVD) are classified by operating pressure such as atmospheric pressure, low-pressure, and ultra high vacuum or by physical characteristics of the vapor such as aerosol assisted CVD, direct liquid injection CVD, plasma CVD, hot wire CVD, and metalorganic CDV, for example. Tri-isobutyl aluminum, tri-ethyl/methyl aluminum and dimethyl aluminum hydride are exemplary of volatile metalorganic compounds from which aluminum films can be deposited.

In laser or electron beam deposition a thin film of metal is deposited by focusing a pulsed laser or an electron beam to strike a target of the material that is to be deposited (i.e. the malleable metal), vaporizing the metal from the target in a plasma plume and depositing the vaporized metal on the object to be coated. Vaporized metal from the plasma plume deposits as a thin film on a substrate positioned in proximity to the plasma plume. The process can occur under vacuum or in the presence of a background gas. For many materials an applied laser wavelength of about 10 nm is exemplary of a suitable wavelength. Parameters such as laser flux and energy, electon beam intensity or energy, surface temperature of the substrate, surface preparation of the substrate, and background pressure are exemplary parameters that can be adjusted to obtain the the desired degree and quality of coating.

Sputtering or sputter deposition is a physical vapor deposition method in which the material that is to form the coating is ejected from a source of the coating material forming a vapor which is subsequently deposited on the substrate to be coated. Sputtering is accomplished by creating a gaseous plasma and accelerating ions from the plasma into the source of the coating material. The source material is eroded by the arriving ions via energy transfer and coating material is ejected which travels until it strikes a surface in its path such as the surface to be coated. Sputtering can be accomplished at low substrate temperatures. Therefore sputtering is particularly useful for applying thin coatings to non-metallic surfaces. Further, coating materials with high melting points can be sputtered readily while maintaining the substrate to be coated at a low temperature.

As indicated above, the adhesion of the metal to the surface of the seal and the thickness of the metal should be such that the thin metal coating is compatibly deformable with the seal as well as sufficiently thick to prevent selected gas diffusion and/or photon transmission through the seal. In some embodiments, an aluminum coating of 200 Å is an effective oxygen diffusion barrier and an aluminum thickness of at least 1000 Å is need to block all wavelengths of visible light, for example. The thickness required to block a full range of gases and the thickness to block optical transmission in the visible wavelength range for other metals will typically vary from that for aluminum. The thickness of the metal coating is an adjustable parameter that is adjusted according to the metal selected and the desired properties of the coating.

Figure 2:
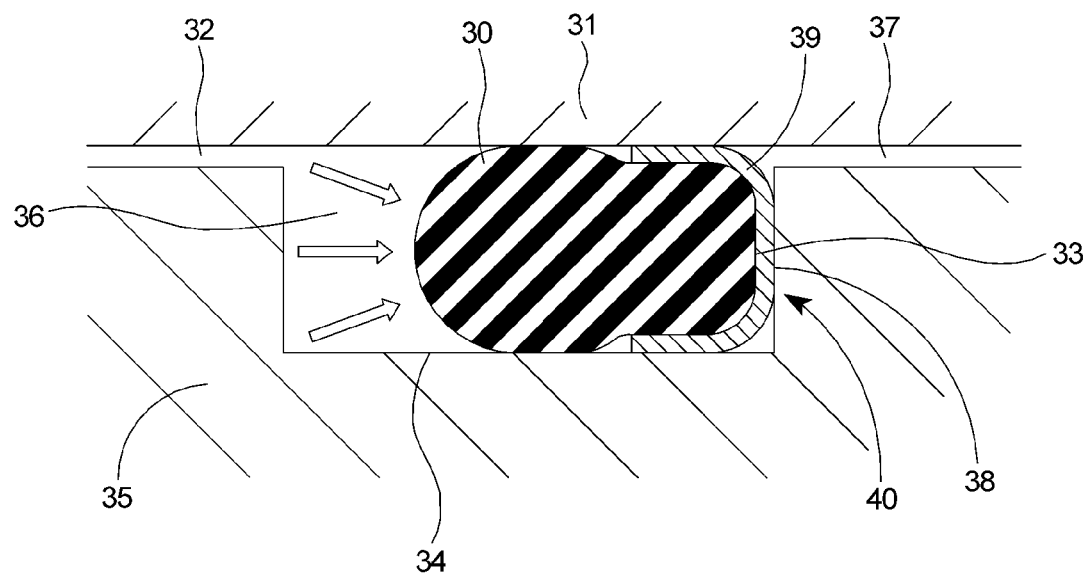
FIG. 2 is a schematic cross-sectional representation of an embodiment of a coated o-ring of the invention in use and subjected to applied pressure in the in use position.

FIG. 2 is a cross sectional schematic diagram of an exemplary embodiment of an o-ring 30 of the invention in use showing a cross sectional portion of the o-ring body. The sealed joint between joint surfaces 31, 35 is an exemplary sealed joint in a vessel or pipe. A fluid under pressure 36 enters the joint via left crevice 32, and right crevice 37 is contiguous with the portion of the vessel volume that low pressure or vacuum and must remain free of atoms or molecules of the pressurized fluid. In this example, o-ring 30 comprising an elastomeric material is coated with a metal coating 39 on the interior surface 33. Joint surface 35 has an o-ring groove 40. The o-ring groove 40 is designed to initially squeeze the o-ring 30 such that the outer surface elastomer of the o-ring 30 initiates a seal against the upper joint surface 31 and the o-ring groove bottom 34. The metal coating 39 of o-ring 30 interior surface 33 seals to joint surface 31 and o-ring groove bottom 34. When fluid pressure 36 is applied from the left, the elastomer acts as a very viscous fluid, conveying the pressure of the pressurized fluid 36 to the bulk of the elastomeric material of o-ring 30 and joint surface 31 and o-ring groove bottom 34. Additionally, the fluid pressure enhances the secondary seal between the metal coating 39, and the joint surface 31, o-ring groove bottom 34, and establishes a seal against o-ring groove side 38. Optionally the seal can be made more effective with increasing pressure differences, reaching the limit of enhancement when the elastomer is extruded into the right crevice 37. The thin metal coating 39 forming the seal with the joint surface 31, o-ring groove bottom 34, and o-ring groove side 38 inhibits diffusion of the atoms or molecules of the pressurized fluid 36 (and/or any remaining gases in the elastomer itself) and/or to transmission of photons through the metal coating 39. The scope of gases and/or wavelengths of photons that are blocked are dependent on the nature and thickness of the metal that comprises the metal coating 39.

In some embodiments it may be desirable to treat the contact surfaces of the joint to be sealed prior to positioning the coated o-ring in position to facilitate the seating process. Treatments may include, but are not limited to, cleaning the surface with a solvent, flushing the surfaces with pressurized gas and/or polishing one or both of the contact surfaces.

The invention has been discussed in detail as it relates to diffusion inhibiting o-rings and said o-rings are particularly well suited as an inexpensive, convenient devices for sealing the connections between components in high vacuum and ultrahigh vacuum systems to prevent diffusion of gases and/or photons and provide an inexpensive and reusable alternative to the all metal gaskets currently used in high vacuum and ultra-high vacuum applications. However, the method is not limited to o-rings and may be applied to other types of polymeric and/or fiber seals to coat at least a portion of the surface of the elastomeric seal to inhibit gas diffusion and/or photon transmission.

What is at present considered the preferred embodiment and alternative embodiments of the present invention has been shown and described herein. It will be obvious to those skilled in the art that various changes and modifications may be made therein without departing from the scope of the invention as defined by the appended claims.

What is claimed is:

1. A gas diffusion inhibiting dual seal o-ring for sealing a joint between a fluid under pressure and a vacuum, comprising:
   a solid elastomeric body including an interior surface and an exterior surface;
   at least one of said interior surface and said exterior surface of said elastomeric body is uncoated to form a primary seal portion;
   the side opposing said uncoated side of said elastomeric body coated with a malleable metal film coating of a constant thickness forming a secondary seal portion;
   said metal coating being compatibly deformable with said solid elastomeric body, whereby said primary seal portion forms a primary seal in said joint and said metal coating on said secondary seal portion establishes a secondary seal in said joint; and
   said metal coating of said secondary seal portion preventing gas diffusion through said dual seal o-ring.

2. The o-ring of claim 1, wherein the coating of malleable metal has a thickness of about 100 Å to about 2000 Å.

3. The o-ring of claim 1, wherein the malleable metal is selected from the group consisting of aluminum, copper, indium, gold, rhodium, platinum and combinations thereof.

4. The o-ring of claim 1, wherein the diffusion inhibiting o-ring is opaque to photons of all wavelengths of light.

5. The o-ring of claim 4, wherein the malleable metal coating is gold.

6. The o-ring of claim 1, wherein the o-ring is solvent resistant.

* * * * *